(12) United States Patent
Mackh et al.

(10) Patent No.: US 8,809,165 B2
(45) Date of Patent: Aug. 19, 2014

(54) METHOD FOR FUSING A LASER FUSE AND METHOD FOR PROCESSING A WAFER

(75) Inventors: Gunther Mackh, Neumarkt (DE); Gerhard Leschik, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/594,946

(22) Filed: Aug. 27, 2012

(65) Prior Publication Data
US 2014/0057412 A1 Feb. 27, 2014

(51) Int. Cl.
*H01L 21/00* (2006.01)

(52) U.S. Cl.
USPC ............... 438/463; 438/799; 257/E21.592

(58) Field of Classification Search
CPC .................................. H01L 23/5258
USPC .......... 438/215, 281, 799, 463; 257/E21.592, 257/209
See application file for complete search history.

(56) References Cited

U.S. PATENT DOCUMENTS

| 5,747,868 | A | 5/1998 | Reddy et al. |
| 6,483,166 | B2 * | 11/2002 | Benedix ................ 257/529 |
| 2003/0062591 | A1 * | 4/2003 | Jensen et al. .......... 257/529 |
| 2007/0173075 | A1 * | 7/2007 | Lee et al. ............... 438/795 |
| 2010/0181673 | A1 * | 7/2010 | Hayashi et al. ........ 257/754 |
| 2011/0132885 | A1 * | 6/2011 | Sercel et al. ........ 219/121.72 |

FOREIGN PATENT DOCUMENTS

EP 0902474 A2 3/1999

OTHER PUBLICATIONS http://www.disco.co.jp/eg/solution/library/stealth.html, Kiru, Kezuru, Migaku Topics, Stealth Dicing Application, pp. 1-3, Apr. 18, 2012.
Microelectronic Engineering 60 (2002), "NiSi salicide technology for scaled CMOS", Hiroshi Iwai et al, pp. 157-169, 2002, Elsevier Science B.V.

* cited by examiner

*Primary Examiner* — Caridad Everhart

(57) ABSTRACT

A method for fusing a laser fuse in accordance with various embodiments may include: providing a semiconductor workpiece having a substrate region and at least one laser fuse; fusing the at least one laser fuse from a back side of the substrate region by means of an infrared laser beam.

30 Claims, 5 Drawing Sheets

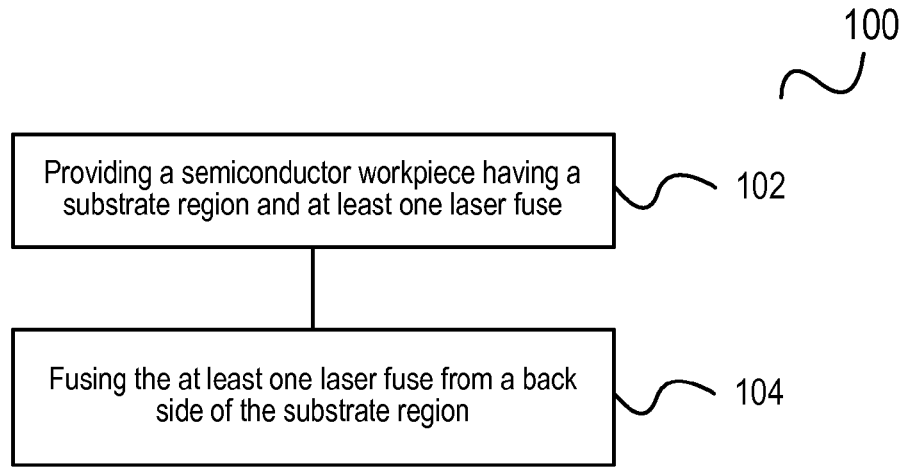
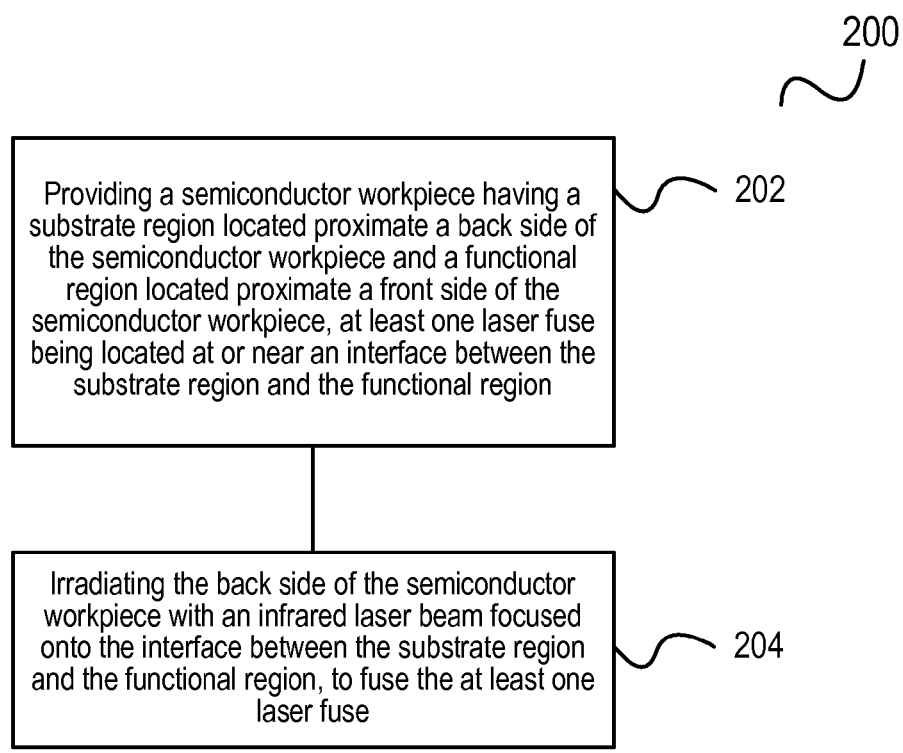

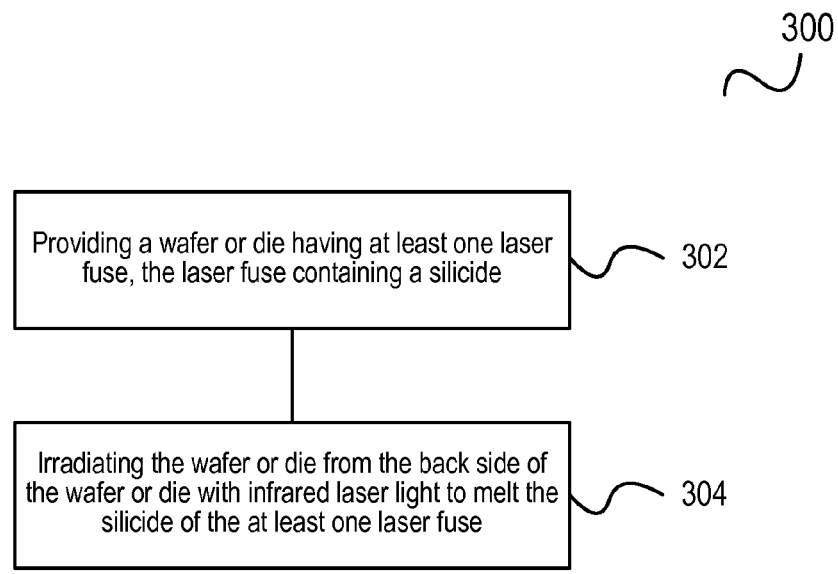
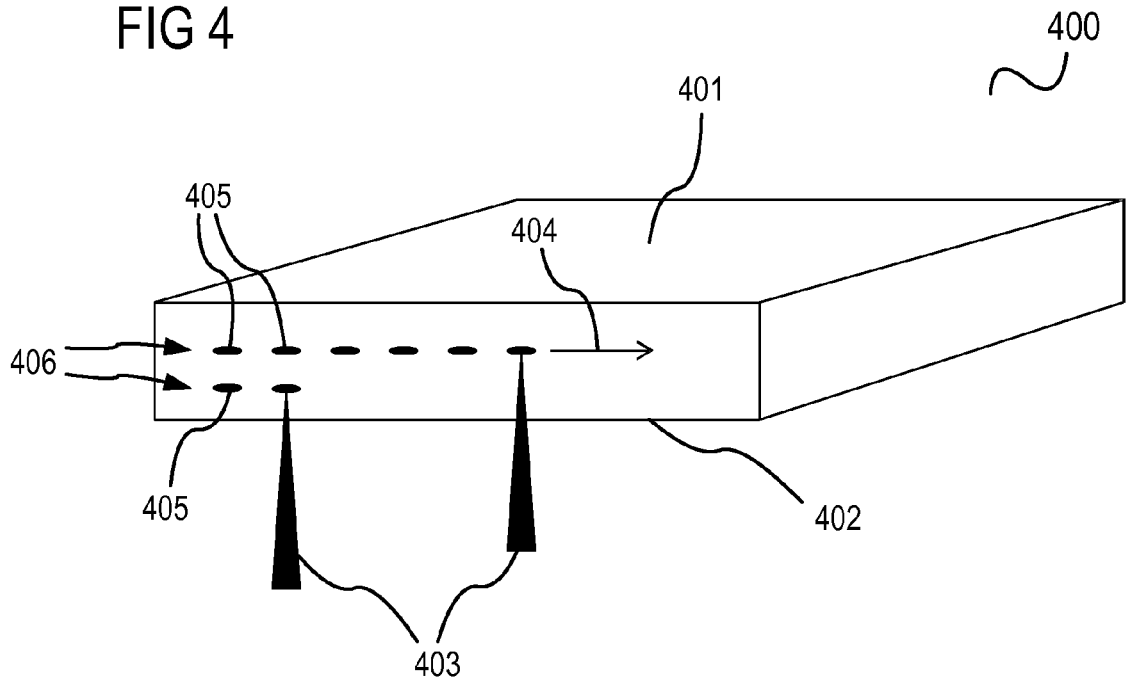

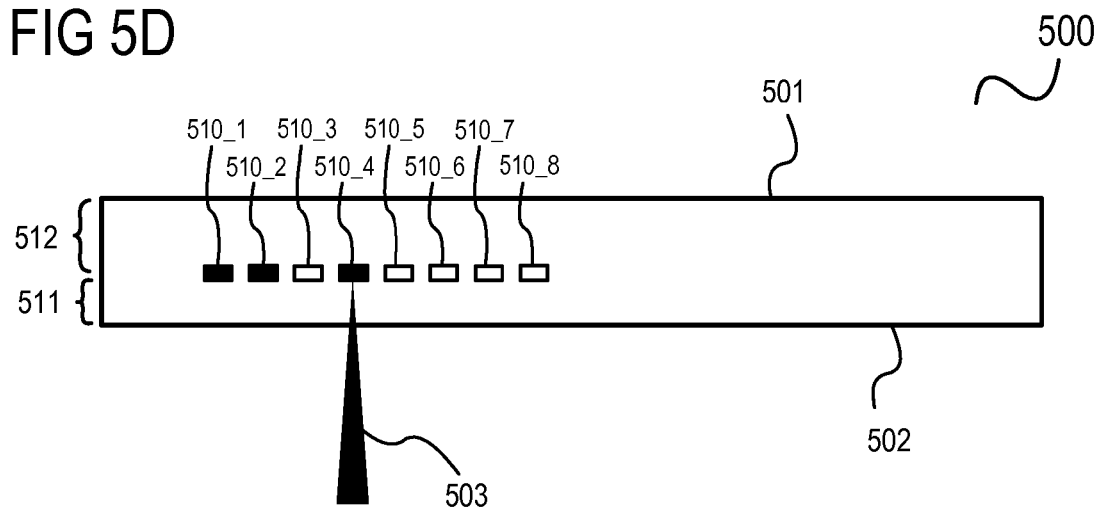
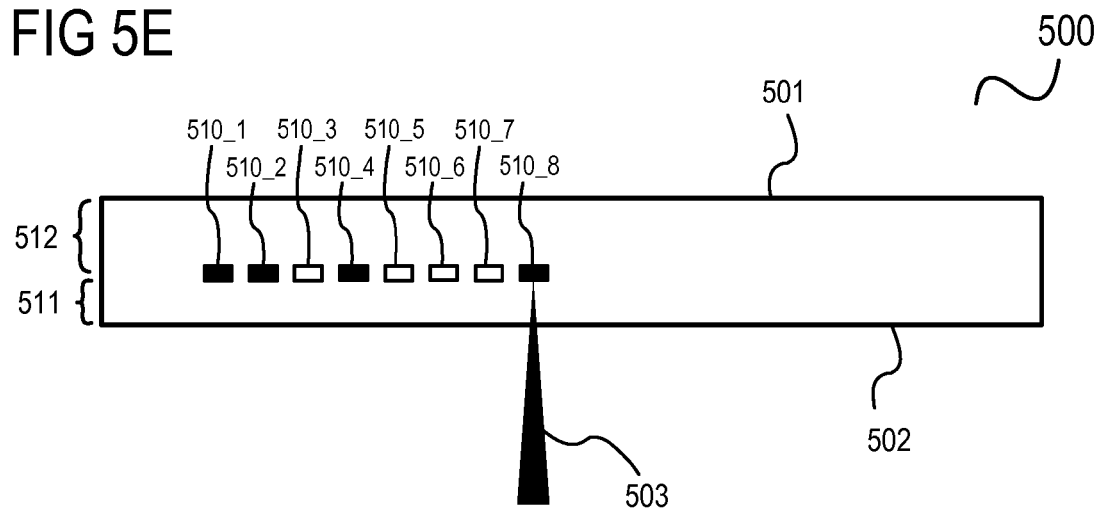

US 8,809,165 B2

METHOD FOR FUSING A LASER FUSE AND METHOD FOR PROCESSING A WAFER

TECHNICAL FIELD

Various embodiments relate generally to a method for fusing a laser fuse and a method for processing a wafer.

BACKGROUND

In the fabrication of electronic devices, e.g. integrated circuits or chips, fuses may sometimes be used. A fuse (sometimes also referred to as fuse link or fusible link) may be understood as an electrical link or interconnect that may selectively be cut or blown (so-called fusing).

Fusing may, for example, be achieved by a laser. A fuse that may be fused by a laser may also be referred to as a laser fuse (or laser fuse link or laser fusible link), and fusing a laser fuse may also be referred to as laser fusing.

SUMMARY

A method for fusing a laser fuse in accordance with various embodiments may include: providing a semiconductor workpiece having a substrate region and at least one laser fuse; fusing the at least one laser fuse from a back side of the substrate region by means of an infrared laser beam.

A method for fusing a laser fuse in accordance with various embodiments may include: providing a semiconductor workpiece having a substrate region located proximate a back side of the semiconductor workpiece and a functional region located proximate a front side of the semiconductor workpiece, at least one laser fuse being located at or near an interface between the substrate region and the functional region; irradiating the back side of the semiconductor workpiece with an infrared laser beam focused onto the interface between the substrate region and the functional region, to fuse the at least one laser fuse.

A method for fusing a laser fuse in accordance with various embodiments may include: providing a wafer or die having at least one laser fuse containing a silicide; irradiating the wafer or die from the back side of the wafer or die with infrared laser light to melt the silicide of the at least one laser fuse.

A method for processing a wafer in accordance with various embodiments may include: providing a wafer having at least one laser fuse; fusing the at least one laser fuse from the wafer back side; and stealth dicing the wafer; wherein fusing the at least one laser fuse and stealth dicing the wafer are carried out using the same infrared laser.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 1 shows a method for fusing a laser fuse in accordance with an embodiment;

FIG. 2 shows a method for fusing a laser fuse in accordance with another embodiment;

FIG. 3 shows a method for fusing a laser fuse in accordance with another embodiment;

FIG. 4 shows a perspective view of a wafer for illustrating aspects of one or more embodiments;

FIG. 5A to FIG. 5E show cross-sectional views of a die during various processing stages for illustrating aspects of one or more embodiments;

DESCRIPTION

Figure 5A:
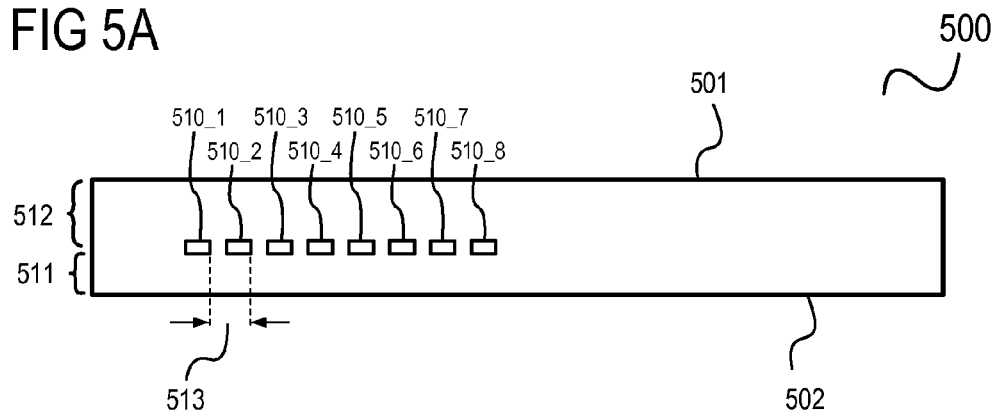

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various aspects of the disclosure are provided for methods, and various aspects of the disclosure are provided for devices. It will be understood that basic properties of the methods also hold for the devices and vice versa. Therefore, for sake of brevity, duplicate description of such properties may be omitted.

The term "at least one" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The terms "disposed over", "located over" or "arranged over" as used herein are intended to include arrangements where a first element or layer may be disposed, located or arranged directly on a second element or layer with no further elements or layers in-between, as well as arrangements where a first element or layer may be disposed, located or arranged above a second element or layer with one or more additional elements or layers between the first element or layer and the second element or layer.

In the fabrication of semiconductor devices, e.g. integrated circuits or chips, fuses may sometimes be used. A fuse (sometimes also referred to as fuse link or fusible link) may be understood as an electrical link that may selectively be cut or blown (so-called fusing). Fusing may, for example, be achieved by a laser. A fuse that may be fused by means of a laser may also be referred to as a laser fuse (or laser fuse link or laser fusible link), and fusing a laser fuse may also be referred to as laser fusing.

Laser fusing may, for example, be performed after wafer testing to implement ID (identification) information or tune devices to meet tight specifications.

Conventional laser fusing methods may be hardly compatible, or not compatible at all, with modern low-k or ultra-low-k dielectrics (i.e. dielectrics having a low or ultra-low value of their dielectric constant k). For example, conventional laser fusing methods may oftentimes lead to large delaminations of those dielectrics.

Furthermore, conventional laser fusing methods may typically result in exposure of the fuse. In other words, material layers located on or above the fuse may be removed at least partially as a consequence of the fuse process, thereby exposing the fuse. This may lead to corrosion caused by humidity at the fuse area, which may constitute a reliability risk.

Furthermore, conventional laser fusing methods may lead to extensive damage in the vicinity of a fuse, which in turn may require that a distance (pitch) between fuses be large (for example, greater than 10 μm) and/or that no other structures be located over the fuse(s) to avoid damage of neighboring fuses or other structures when fusing a particular fuse. Thus, fuses used with conventional laser fusing methods may consume large chip areas.

Furthermore, conventional laser fusing methods may often need to be implemented as an extra process step in the fabrication process. This may result in an increase of the processing costs.

FIG. 1 shows a method 100 for fusing a laser fuse in accordance with an embodiment.

At 102, a semiconductor workpiece may be provided, the semiconductor workpiece having a substrate region and at least one laser fuse.

At 104, the at least one laser fuse may be fused from a back side of the substrate region by means of an infrared laser beam.

In accordance with an embodiment, the semiconductor workpiece may include or may be a wafer. In accordance with another embodiment, the semiconductor workpiece may include or may be a die.

In accordance with an embodiment, the wafer or die may be a silicon wafer or die, although the wafer or die may contain or consist of other materials, e.g. other semiconductor materials, including compound semiconductor materials, as well.

In accordance with another embodiment, the substrate region may be located proximate a back side of the semiconductor workpiece (e.g. proximate a back side of the wafer or die), and the semiconductor workpiece may further include a functional region located proximate a front side of the semiconductor workpiece (e.g. proximate a front side of the wafer or die); the at least one laser fuse may be located at or near an interface between the substrate region and the functional region, and the infrared laser beam may be focused onto the interface.

In accordance with another embodiment, the infrared laser beam may be configured (or applied) such that integrity of structures located in the functional region on or above the at least one laser fuse is substantially (or entirely) maintained after fusing the at least one laser fuse.

In one or more embodiments, the at least one laser fuse may contain or consist of a silicide. Illustratively, the fusible material of the at least one laser fuse may include or may be a silicide.

In accordance with another embodiment, the silicide may be selected from a group of silicides having an activation temperature of less than or equal to about 750° C., for example less than or equal to about 550° C., for example less than or equal to about 350° C. In one or more embodiments, the activation temperature of a silicide may include or be a temperature, at which a phase transition of the silicide occurs. In one or more embodiments, the activation temperature may include or be a temperature, at which diffusion of metal atoms or ions into silicon or polysilicon increases significantly. In one or more embodiments, the activation temperature may include or be a temperature, at which an electrical resistance of the silicide changes significantly, for example due to the aforementioned increased metal diffusion.

In accordance with another embodiment, the silicide may be selected from a group of silicides, the group consisting of: tungsten silicide, molybdenum silicide, titanium silicide, cobalt silicide, and nickel silicide.

In accordance with another embodiment, the at least one laser fuse may include or may be a polycide (i.e. silicide formed over polysilicon), for example a silicided polysilicon pattern or structure, for example a silicided polysilicon trace or interconnect.

In accordance with another embodiment, the infrared laser beam may have a wavelength in the range from about 1.0 μm to about 1.4 μm, for example a wavelength of 1064 nm, 1080 nm, or 1342 nm, although other wavelengths may be possible as well.

In accordance with another embodiment, the functional region may include at least one circuit structure or device, for example, a pad (e.g. metal pad), an interconnect, a wiring line, a resistor (e.g. metal resistor), a capacitor (e.g. a MIM capacitor), a diode, a transistor, or others.

In accordance with another embodiment, the functional region may include a front-end-of-line layer arrangement, for example including one or more electrically conductive layers (e.g. metal layers) and/or one more electrically insulating layers or dielectric layers (e.g. low-k or ultra-low-k dielectric layers).

In accordance with another embodiment, the laser beam may have a power in the range from about 0.1 W to about 0.5 W, although other values may be possible as well.

In accordance with another embodiment, the semiconductor workpiece may include a plurality of laser fuses, a fuse pitch of the plurality of laser fuses being less than or equal to about 10 μm, for example in the range from about 5 μm to about 10 μm in accordance with another embodiment, for example about 10 μm in accordance with another embodiment, although other values of the pitch (e.g. pitches less than or equal to about 5 μm, or pitches greater than about 10 μm) may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, fusing the at least one laser fuse may include fusing one or more of the plurality of laser fuses.

In accordance with another embodiment, the semiconductor workpiece may include or may be a wafer, and the wafer may be diced using the infrared laser beam.

In accordance with another embodiment, dicing the wafer may be carried out after fusing the at least one laser fuse (or the one or more of the plurality of laser fuses).

In accordance with another embodiment, dicing the wafer may be carried out before fusing the at least one laser fuse (or the one or more of the plurality of laser fuses).

FIG. 2 shows a method 200 for fusing a laser fuse in accordance with another embodiment.

At 202, a semiconductor workpiece may be provided, the semiconductor workpiece having a substrate region located proximate a back side of the semiconductor workpiece wafer or die and a functional region located proximate a front side of the semiconductor workpiece, at least one laser fuse being located at or near an interface between the substrate region and the functional region.

At 204, the back side of the semiconductor workpiece may be irradiated with an infrared laser beam focused onto the interface between the substrate region and the functional region, to fuse the at least one laser fuse.

In accordance with an embodiment, the semiconductor workpiece may include or may be a wafer. In accordance with another embodiment, the semiconductor workpiece may include or may be a die.

In accordance with an embodiment, the wafer or die may be a silicon wafer or die, although the wafer or die may contain or consist of other materials, e.g. other semiconductor materials, including compound semiconductor materials, as well.

In accordance with another embodiment, the infrared laser beam may be configured (or applied) such that integrity of structures located in the functional region on or above the at least one laser fuse is substantially (or entirely) maintained after fusing the at least one laser fuse.

In one or more embodiments, the at least one laser fuse may contain or consist of a silicide.

In accordance with another embodiment, the silicide may be selected from a group of silicides having an activation temperature of less than or equal to about 750° C., for example less than or equal to about 550° C., for example less than or equal to about 350° C.

In accordance with another embodiment, the silicide may be selected from a group of silicides, the group consisting of: tungsten silicide, molybdenum silicide, titanium silicide, cobalt silicide, and nickel silicide.

In accordance with another embodiment, the at least one laser fuse may include or may be a polycide (i.e. silicide formed over polysilicon), for example a silicided polysilicon pattern, for example a silicided polysilicon trace or interconnect.

In accordance with another embodiment, the infrared laser beam may have a wavelength in the range from about 1.0 μm to about 1.4 μm, for example a wavelength of 1064 nm, 1080 nm, or 1342 nm, although other wavelengths may be possible as well.

In accordance with another embodiment, the functional region may include at least one circuit structure or device, for example, a pad (e.g. metal pad), an interconnect, a wiring line, a resistor (e.g. metal resistor), a capacitor (e.g. a MIM capacitor), a diode, a transistor, or others.

In accordance with another embodiment, the functional region may include a front-end-of-line layer arrangement, for example including one or more electrically conductive layers (e.g. metal layers) and/or one more electrically insulating layers or dielectric layers (e.g. low-k or ultra-low-k dielectric layers).

In accordance with another embodiment, the laser beam may have a power in the range from about 0.1 W to about 0.5 W, although other values may be possible as well.

In accordance with another embodiment, the semiconductor workpiece may include a plurality of laser fuses located at or near the interface between the substrate region and the functional region, a fuse pitch of the plurality of laser fuses being less than or equal to about 10 μm, for example, in the range from about 5 μm to about 10 μm in accordance with another embodiment, for example about 10 μm in accordance with another embodiment, although other pitches, e.g. pitches less than about 5 μm, or pitches greater than about 10 μm, may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, fusing the at least one laser fuse may include fusing one or more of the plurality of laser fuses.

In accordance with another embodiment, the semiconductor workpiece may include or may be a wafer, and the wafer may be diced using the infrared laser beam.

In accordance with another embodiment, dicing the wafer may be carried out after fusing the at least one laser fuse (or the one or more of the plurality of laser fuses).

In accordance with another embodiment, dicing the wafer may be carried out before fusing the at least one laser fuse (or the one or more of the plurality of laser fuses).

FIG. 3 shows a method 300 for fusing a laser fuse in accordance with another embodiment.

At 302, a wafer or die may be provided, the wafer or die having at least one laser fuse, the laser fuse containing a silicide.

At 304, the wafer or die may be irradiated from the back side of the wafer or die with infrared laser light to melt the silicide of the at least one laser fuse.

In accordance with an embodiment, the silicide may be selected from a group of silicides having an activation temperature of less than or equal to about 750° C.

In accordance with another embodiment, the silicide may be selected from a group of silicides having an activation temperature of less than or equal to about 550° C.

In accordance with another embodiment, the silicide may be selected from a group of silicides having an activation temperature of less than or equal to about 350° C.

In accordance with an embodiment, the silicide may be selected from a group of silicides, the group consisting of: tungsten silicide, molybdenum silicide, titanium silicide, cobalt silicide, and nickel silicide.

In accordance with another embodiment, the wafer or die may be a silicon wafer or die, although the wafer or die may contain or consist of other materials, e.g. other semiconductor materials, including compound semiconductor materials, as well.

In accordance with another embodiment, the laser light may be focused onto an interface between a substrate region and a functional region of the wafer or die. For example, a focus of the laser light may lie at, close to, or proximate an interface between the substrate region (or substrate, e.g. silicon substrate, SiC substrate, or other type of substrate) and an IC (integrated circuit) layer arrangement or layer stack.

In accordance with another embodiment, the infrared laser beam may have a wavelength in the range from about 1.0 μm to about 1.4 μm, for example a wavelength of 1064 nm, 1080 nm, or 1342 nm, although other wavelengths may be possible as well.

In accordance with another embodiment, the laser beam may have a power in the range from about 0.1 W to about 0.5 W, although other values may be possible as well.

In accordance with another embodiment, the wafer or die may include a plurality of laser fuses located at or near the interface between the substrate region and the functional region, a fuse pitch of the plurality of laser fuses being less than or equal to about 10 μm, for example, in the range from about 5 μm to about 10 μm in accordance with another embodiment, for example about 10 μm in accordance with another embodiment, although other pitches, e.g. pitches less than about 5 μm, or pitches greater than about 10 μm, may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, fusing the at least one laser fuse may include fusing one or more of the plurality of laser fuses.

In accordance with another embodiment, providing a wafer or die may include providing a wafer, and the wafer may be diced using the infrared laser beam.

In accordance with another embodiment, dicing the wafer may be carried out after fusing the at least one laser fuse (or the one or more of the plurality of laser fuses).

In accordance with another embodiment, dicing the wafer may be carried out before fusing the at least one laser fuse (or the one or more of the plurality of laser fuses).

FIG. 4 shows a perspective view of a section of a wafer 400 for illustrating aspects of one or more embodiments.

The wafer 400 may, for example, be a silicon wafer, although the wafer may contain or consist of other materials, e.g. other semiconductor materials, including compound semiconductor materials, as well.

The wafer 400 may have a front side 401 and a back side 402 opposite the front side 401, as shown. The section of the wafer 400 shown in FIG. 4 may be a die region, in other words a region corresponding to a die. Apart from the die region shown in FIG. 4, the wafer 400 may include one or more additional die regions corresponding to one or more additional dies (not shown in FIG. 4). The individual dies of the wafer 400 may be separated (singulated) by dicing the wafer 400. In accordance with some embodiments, dicing the wafer 400 may, for example, be carried out using a so-called stealth dicing process as will be explained in the following.

"Stealth dicing" may be understood to refer to a dicing method that may form a modified layer in a workpiece such as wafer 400 by focusing a laser inside the workpiece. Subsequently, the dies may be separated, for example by using a tape expander.

More particularly, a laser beam 403 at a wavelength capable of transmitting through wafer 400 (typically, a laser having an infrared (IR) wavelength) may be condensed by an objective lens (not shown in FIG. 4) and focused onto a point inside the wafer 400, as shown. The laser beam 403 may, for example, consist of short pulses oscillating at a high repetition rate and may be highly condensed. This localized beam 403 may, for example, be formed at an extremely high peak power density both time and spatially compressed in the vicinity of the light focus point. When the laser beam 403 transmitting through the wafer 400 exceeds a peak power density during the condensing process, a nonlinear absorption effect may cause a phenomenon, in which extremely high absorption occurs at localized points. By optimizing the laser and optical system characteristics to cause the nonlinear absorption effect just in the vicinity of the focal point inside the wafer 400, it may be possible that only localized points or regions 405 in the wafer 400 will be selectively laser-machined without damaging layers or structures in the wafer 400 located above or below those points or regions 405. Illustratively, regions 405 of the wafer 400 may be laser-machined by the laser beam 403, while the remaining areas of the wafer 400 may be unaffected by the laser beam 403.

The laser beam 403 may enter the wafer 400 from the back side 402 of the wafer 400, as shown in FIG. 4.

It should be noted that FIG. 4 shows one and the same laser beam 403 at two different locations (corresponding to two different points in time), and arrow 404 indicates movement of the laser beam's position relative to the wafer 400. Although typically a single laser beam will be used for dicing, it should be noted that, in principle, it may be possible to use a plurality of laser beams simultaneously.

In the example of FIG. 4, the laser-machined regions 405 of wafer 400 are shown as being arranged in two parallel layers 406. However, it may also be possible that the regions 405 are arranged in only one layer, or in more than two layers, depending for example on the material and/or thickness of the wafer 400.

One aspect of one or more embodiments may be seen in that an infrared laser beam (such as laser beam 403 in FIG. 4) typically used for stealth dicing may, alternatively or additionally, be used for laser fusing, as will be described in more detail below.

FIG. 5A to FIG. 5E show cross-sectional views of a die 500 during various processing stages for illustrating aspects of one or more embodiments.

As shown in FIG. 5A, the die 500 may have a front side 501 and a back side 502 opposite the front side 501.

In accordance with one or more embodiments, the die 500 may be part of a wafer (not shown) including one or a plurality of dies. In other words, a wafer having one or more dies (or die regions corresponding to dies) may be provided, the die 500 corresponding to one of the one or more dies (or die regions) of the wafer. In accordance with one or more embodiments, the individual dies of the wafer may be separated later by dicing (die singulation) after fusing one or more laser fuses of the die 500 (and possibly other dies of the wafer). In still other words, die 500 may correspond to one of one or more dies of a wafer before dicing the wafer.

Alternatively, in accordance with one or more embodiments, a wafer including one or more dies (or die regions corresponding to dies) may have already been diced, and the die 500 may correspond to one of the dies obtained from the wafer after dicing the wafer.

In accordance with one or more embodiments, the die 500 may include a plurality of laser fuses 510_1, 510_2, ..., 510_n containing or consisting of a silicide (eight laser fuses are shown as an example in the figure (i.e. n=8), however the die 500 may include a different number of laser fuses in accordance with some embodiments; it may also be possible that only one laser fuse is provided). In accordance with some embodiments, the silicide may be a low-temperature silicide having, for example, an activation temperature of less than or equal to about 750° C., for example less than or equal to about 550° C., for example less than or equal to about 350° C. In accordance with some embodiments, the silicide may, for example, be selected from a group of silicides, the group consisting of: tungsten silicide, molybdenum silicide, titanium silicide, cobalt silicide, and nickel silicide. In accordance with other embodiments, other suitable silicides may be used. Typically, all of the laser fuses 510_1, 510_2, ..., 510_n may contain or consist of the same silicide, however it may also be possible that one or more of the laser fuses 510_1, 510_2, ..., 510_n contain or consist of a different silicide.

In accordance with one or more embodiments, the die 500 may have a substrate region 511 located proximate the back side 502 of the die 500, and a functional region 512 located proximate the front side 501 of the die 500, as shown. The laser fuses 510_1, 510_2, ..., 510_n may, for example, be located at or near an interface between the substrate region 511 and the functional region 512, as shown. Thus, in accordance with one or more embodiments, a distance between the laser fuses 510_1, 510_2, ..., 510_n and the back side 502 of the die 500 may roughly correspond to a thickness of the substrate region 511.

According to the example shown, all of the laser fuses 510_1, 510_2, ..., 510_n may be located or formed in the same layer or level of the die 500. However, it may also be possible that one or more of the laser fuses 510_1, 510_2, ..., 510_n are located or formed in different layers or levels of the die 500.

In accordance with one or more embodiments, the functional region 512 may include a front-end-of-line (FEOL) layer arrangement, for example including one or more electrically conductive layers (e.g. metal layers) and/or one more electrically insulating layers or dielectric layers (e.g. low-k or ultra-low-k dielectric layers).

In accordance with one or more embodiments, the functional region 512, or the FEOL layer arrangement of the functional region 512, may, for example, include one or more circuit structures or devices such as, for example, one or more pads (e.g. metal pads), interconnects or wiring lines, resistors (e.g. metal resistors), capacitors (e.g. MIM capacitors), diodes, or transistors (alternatively, or in addition, other circuit structures or devices may be provided). One or more of the circuit structures or devices may, for example, be located above one or more of the plurality of laser fuses 510_1, 510_2, ..., 510_n.

In accordance with one or more embodiments, the substrate region 511 may be substantially (or entirely) free from circuit structures or devices. For example, in accordance with some embodiments, portions of the substrate region 511 located below one or more of the laser fuses 510_1, 510_2, ..., 510_n may be substantially (or entirely) free from circuit structures or devices.

In accordance with one or more embodiments, one or more of the laser fuses 510_1, 510_2, ..., 510_n may be used to implement information (e.g. ID information). Alternatively, or in addition, one or more of the laser fuses 510_1, 510_2, ..., 510_n may be used to tune one or more circuit structures or devices of the die 500. Alternatively, or in addition, one or more of the laser fuses 510_1, 510_2, ..., 510_n may be used for other purposes.

In accordance with one or more embodiments, a distance (pitch) 513 of the laser fuses 510_1, 510_2, ..., 510_n may, for example, be less than 10 μm, for example in the range from about 5 μm to about 10 μm in accordance with some embodiments, for example about 10 μm in accordance with some embodiments. However, in accordance with some embodiments, other values of the pitch 513 may be possible, for example pitches less than about 5 μm, or pitches greater than about 10 μm.

Figure 5B:
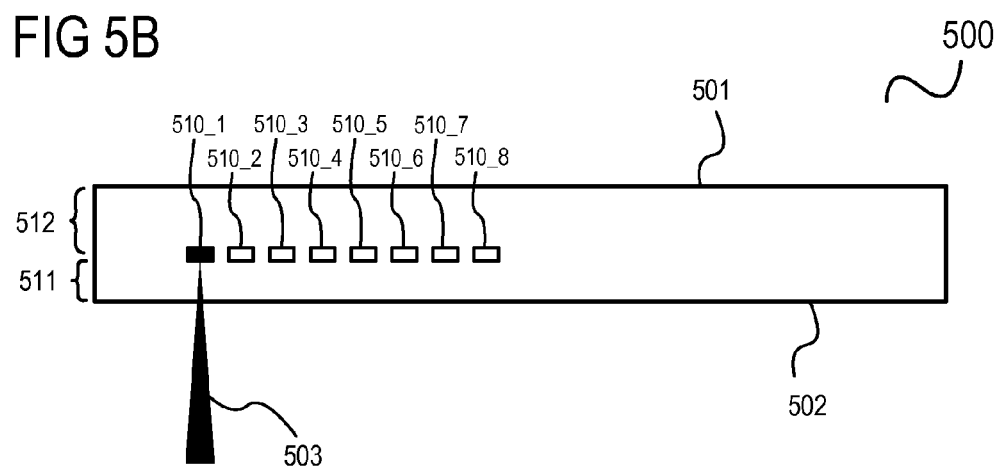

As shown in FIG. 5B, a first laser fuse 510_1 of the laser fuses 510_1, 510_2, ..., 510_n may be fused by means of applying an IR (infrared) laser beam 503 from the back side 502 of the die 500. For example, the back side 502 of the die 500 may be irradiated with the IR laser beam 503 focused onto the interface between the substrate region 511 and the functional region 512, to fuse the first laser fuse 510_1 of the laser fuses 510_1, 510_2, ..., 510_n.

Illustratively, the laser beam 503, for example one or more laser parameters of the laser beam 503 (e.g. focus, wavelength, power, lasing time, etc.), may be configured such that the laser beam 503 may be able to locally melt the silicide of the first laser fuse 510_1, while regions adjacent to the first laser fuse 510_1 remain unaffected. In particular, a second laser fuse 510_2, which is nearest neighbor to the first laser fuse 510_1, (as well as third, fourth, ..., n-th laser fuses 510_3, 510_4, ..., 510_n located farther away from the first laser fuse 510_1) may remain unaffected by the laser beam 503. Furthermore, structures in the functional region 512 located above the first laser fuse 510_1 may also remain unaffected (in other words, undamaged) by the laser beam 503. In other words, the infrared laser beam 503 may be configured (or applied) such that integrity of structures located in the functional region 512 on or above the laser fuse 510_1 may be substantially (e.g. entirely) maintained after fusing the first laser fuse 510_1. As may be seen in FIG. 5B, after fusing the first laser fuse 510_1, the first laser fuse 510_1 may remain encapsulated within the die 500. In other words, by means of the IR laser fusing it may be avoided that parts of the fuse 510_1 become exposed. Thus, corrosion due to humidity may be avoided.

Figure 5C:
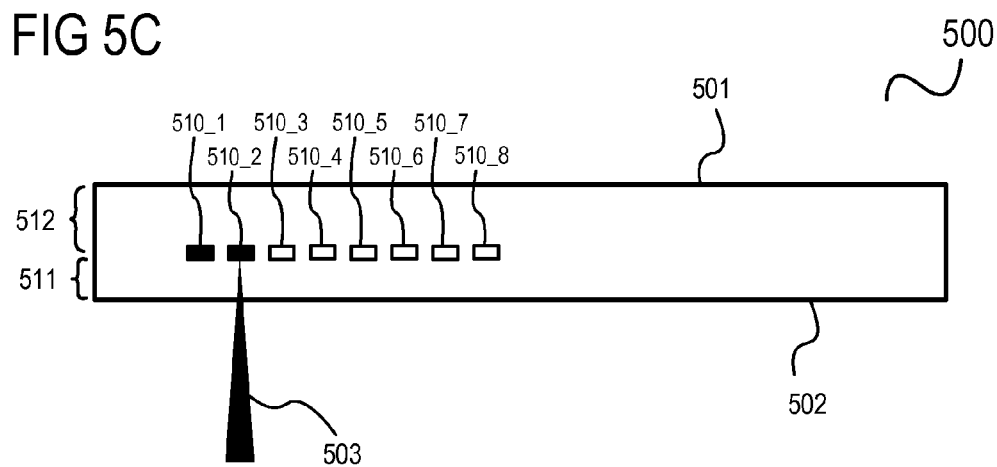

As shown in FIG. 5C to FIG. 5E, after fusing the first laser fuse 510_1, additional laser fuses of the plurality of laser fuses 510_1, 510_2, ..., 510_n may be fused in a similar manner as described in connection with the first laser fuse 510_1. In the example shown in FIG. 5C to FIG. 5E, a second laser fuse 510_2, a fourth laser fuse 510_4, and an eight laser fuse 510_8 of the plurality of laser fuses 510_1, 510_2, ..., 510_n are fused while a third laser fuse 510_3, a fifth laser fuse 510_5, a sixth laser fuse 510_6, and a seventh laser fuse 510_7 remain unfused (however, other fuses may be fused alternatively or in addition in accordance with other embodiments, as will be readily understood). To this end, the laser beam 503's position relative to the die 500 may be moved subsequently to the locations of the second laser fuse 510_2, fourth laser fuse 510_4, and eighth laser fuse 510_8, as shown in FIG. 5C to FIG. 5E (for example, by moving the die 500 relative to the laser beam 503 or moving the laser beam 503 relative to the die 500). Although it is shown that the first laser fuse 510_1 is fused first, the second laser fuse 510_2 is fused after the first laser fuse 510_1, the fourth laser fuse 510_4 is fused after the second laser fuse 510_2, and the eighth laser fuse 510_8 is fused after the fourth laser fuse 510_4 (i.e. the fusing sequence is 510_1→510_2→510_4→510_8) it should be noted that the fusing sequence may be arbitrary in general and may, for example, be determined by the laser programming.

It should be noted that during movement of the laser beam 503's position from the location of a first fuse to be fused to the location of another fuse to be fused, the laser beam 503 may be turned off in order to avoid damage of the regions between the two fuses.

FIG. 5A to FIG. 5E show that one or more laser fuses located within a wafer or die and containing or consisting of a silicide, e.g. a low-temperature silicide such as titanium silicide, cobalt silicide, or nickel silicide (others may be possible as well), may be fused by means of an IR (infrared) laser, for example an IR laser such as may be typically used in so-called "stealth dicing" processes. The IR laser may irradiate the back side of the wafer or die and the IR laser beam may be condensed and focused onto the location(s) of the one or more laser fuses in the wafer or die. Thus, the laser may locally melt the silicide of the fuse(s), while structures in the vicinity of the fuse(s) (for example, other laser fuses, or circuit structures or devices of the wafer or die) may remain substantially or entirely undamaged.

In accordance with some embodiments, the IR laser fusing may be applied before dicing a wafer. In accordance with other embodiments, the IR laser fusing may be applied after dicing the wafer. In accordance with some embodiments, IR laser fusing and dicing may be achieved using the same laser equipment, for example equipment which may already be available for "stealth laser dicing". In this case, the laser fusing option may be implemented by suitably programming the laser equipment. However, it may also be possible to implement the IR laser fusing option in processes that use other dicing methods such as e.g. sawing.

Figure 6:
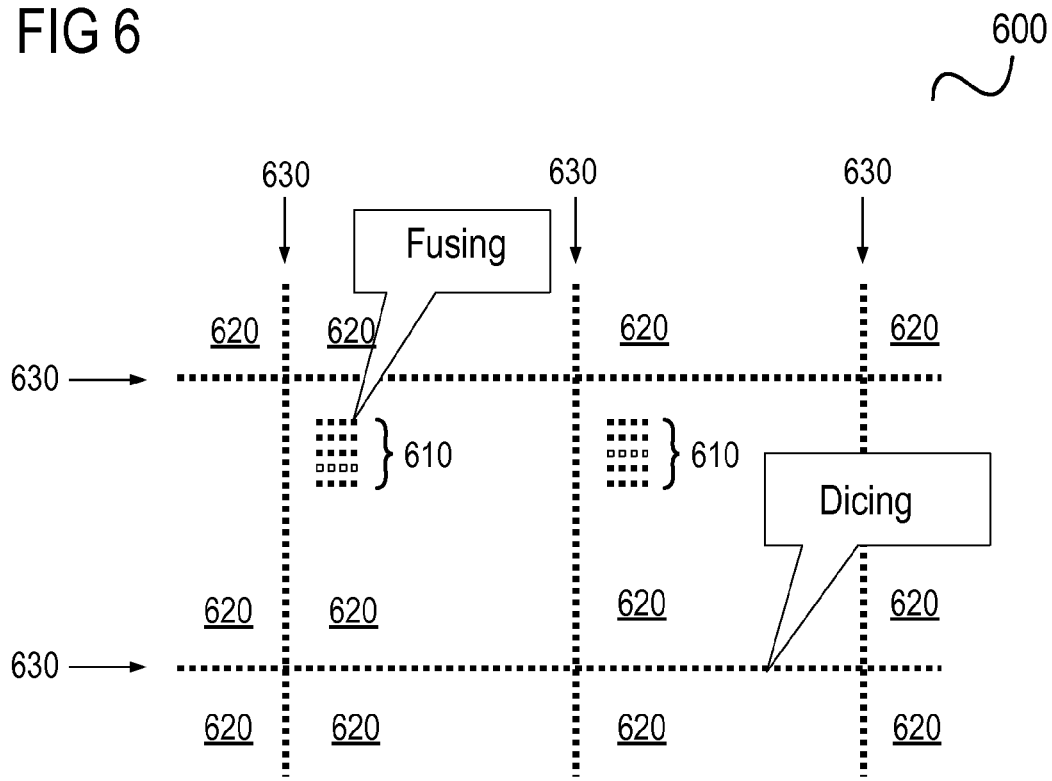
FIG. 6 shows a plan view of a wafer for illustrating aspects of one or more embodiments.

FIG. 6 shows a plan view of a wafer 600 for illustrating aspects of one or more embodiments.

The wafer 600 may include a plurality of die regions 620, in other words regions corresponding to individual dies.

One or more of the die regions 620 may contain one or more laser fuses 610, as shown. The laser fuses 610 may contain or consist of a silicide and may, for example, be configured in accordance with one or more embodiments described herein. The laser fuses 610 may, for example, be arranged in an array or bank (also referred to as fuse bank). Some of the fuses 610 may be fused (represented by filled rectangles) while others of the fuses 610 may remain unfused (represented by open rectangles). Fusing may be achieved by means of a back side IR laser fusing method in accordance with one or more embodiments.

Dies may be obtained from the wafer 600 by dicing the wafer 600 along lines 630. In accordance with some embodiments, dicing may be achieved by means of a stealth laser dicing process, using for example the same equipment as used for the back side laser fusing. Dicing may be carried out after the laser fusing in accordance with some embodiments, or before the laser fusing in accordance with other embodiments. In accordance with some embodiments, dicing may be carried out using a different dicing method than stealth laser dicing, for example by means of sawing, or any other suitable dicing method known as such in the art.

Figure 7:
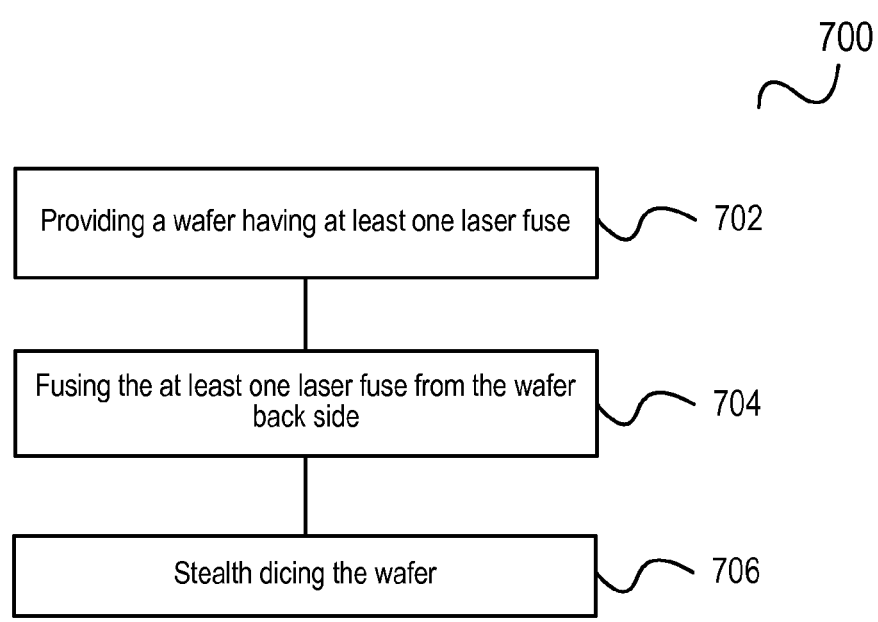
FIG. 7 shows a method for processing a wafer in accordance with another embodiment.

FIG. 7 shows a method 700 for processing a wafer in accordance with another embodiment.

At 702, a wafer may be provided. The wafer may have at least one laser fuse.

At 704, the at least one laser fuse may be fused from the wafer back side.

At 706, the wafer may be stealth diced.

Fusing the at least one laser fuse and stealth dicing the wafer may be carried out using the same infrared laser.

In accordance with an embodiment, stealth dicing the wafer may be carried out after fusing the at least one laser fuse.

In accordance with another embodiment, stealth dicing the wafer may be carried out before fusing the at least one laser fuse.

In accordance with another embodiment, the at least one laser fuse may contain or consist of a silicide.

The method 700 may further be configured in accordance with one or more embodiments described herein.

In the following, various aspects and potential effects of one or more embodiments are discussed.

In accordance with various embodiments, new methods for laser fusing may be provided.

In accordance with various embodiments, an infrared (IR) laser for back side laser stealth dicing may be enabled or configured to fuse one or more silicided poly patterns also from the wafer back side (for example, directly before or after stealth dicing in accordance with some embodiments, or as a separate process step for different dicing methods (e.g. sawing)).

One aspect of various embodiments may be seen in that it has been discovered that IR lasers, such as IR lasers typically used for back side stealth dicing, may be used to melt silicided polysilicon structures. In accordance with various embodiments, this discoverage may be exploited in that wafers or dies with laser fuses based on silicide structures (e.g. silicided polysilicon structures) may be provided, and the fuses may be fused by the IR laser light.

In accordance with some embodiments, stealth dicing may be used as double purpose step, i.e. for die separation (dicing) and fusing, on the same equipment. In other words, an IR laser used for stealth dicing may be used for laser fusing as well, in accordance with some embodiments. This may, for example, reduce processing costs.

Laser fusing methods in accordance with some embodiments may, for example, allow for fuses to be provided or arranged with low area consumption on a wafer or die (e.g. with a small fuse pitch, e.g. a pitch less than or equal to about 10 μm, for example in the range from about 5 μm to about 10 μm, for example about 10 μm, although other pitches (e.g. pitches less than or equal to about 5 μm, or pitches greater than about 10 μm) may be possible as well). For example, design rules may be much smaller for silicide fuses (as may be used in accordance with various embodiments) than for conventional metal laser fuses. High area gain may furthermore be achieved by laser processing from the back side as, for example, damage to regions of the wafer or die located in the vicinity of (e.g. above) the fuse(s) may be reduced or prevented. Thus, it may be possible that even metal areas on top of a fuse or fuses may be used by wiring or even other devices (e.g. metal resistor, MIM capacitor, metal pad, etc.).

Laser fusing methods in accordance with some embodiments may, for example, enable the laser fuse option for current or future technology generations (e.g. 65 nm technology generation and below) where brittle dielectrics may not allow laser fusing from the top side. Laser fusing methods in accordance with some embodiments, on the contrary, may be compatible with modern low-k oder ultra-low-k dielectrics.

Laser fusing methods in accordance with some embodiments may, for example, eliminate a reliability risk of corrosion due to humidity from the top side. For example, silicide fuses used in accordance with various embodiments may be completely buried and encapsulated by the wafer or die before as well as after the laser fusing. Fusing the silicide fuses may illustratively lead to locally melting the fuse material (silicide) within the wafer or die, without creating openings in the wafer or die that would expose the fuse. Thus, exposure of the fuses to humidity may be prevented, and thus corrosion may be prevented.

In accordance with various embodiments, sensitivity of modern silicide compounds, such as e.g. titanium silicide, cobalt silicide, or nickel silicide, to stealth laser processes may be exploited for laser fusing. Commercially available stealth laser heads with wavelengths in the range from about 1 μm to about 1.4 μm (e.g. with a wavelength of 1064 nm, 1080 nm, or 1342 nm in accordance with some embodiments, although other wavelengths may be possible as well) may locally destroy low-temperature silicides (in other words, silicides having a low activation temperature, for example an activation temperature less than or equal to about 750° C. in accordance with some embodiments, for example less than or equal to about 550° C. in accordance with some embodiments, for example less than or equal to about 350° C. in accordance with some embodiments) depending on laser parameters.

In accordance with various embodiments, one or more laser fuses may be provided that may include or may be made of one or more silicided polysilicon patterns. Layout and/or functionality of the fuse(s) may, for example, be similar to conventional metal fuses. In accordance with various embodiments, fusing may be achieved from the wafer back side before or after chip separation (dicing). Chip separation (dicing) may typically also be achieved by laser stealth dicing, however other dicing methods (e.g. sawing or others) may be used as well in accordance with some embodiments. To achieve fusing by using the stealth dicing equipment, the software of the stealth dicing equipment may be adapted in a suitable manner. Back side alignment as for back side stealth dicing may be applied in accordance with some embodiments. In accordance with various embodiments, the equipment may be configured to translate fuse information into a corresponding laser pattern. In accordance with various embodiments, one or more laser parameters (e.g. focus, wavelength, power, etc.) may be selected or adapted suitably such that the laser beam may disconnect silicided interconnects. In accordance with some embodiments, the laser may be programmed to perform small periods of lasering.

A method for fusing a laser fuse in accordance with one or more embodiments may include: providing a semiconductor workpiece having a substrate region and at least one laser fuse; fusing the at least one laser fuse from a back side of the substrate region by means of an infrared laser beam.

In accordance with an embodiment, the semiconductor workpiece may include or may be a wafer. In accordance with another embodiment, the semiconductor workpiece may include or may be a die.

In accordance with an embodiment, the wafer or die may be a silicon wafer or die, although the wafer or die may contain or consist of other materials, e.g. other semiconductor materials, including compound semiconductor materials, as well.

In accordance with another embodiment, the substrate region may be located proximate a back side of the semiconductor workpiece (e.g. proximate a back side of the wafer or die), and the semiconductor workpiece may further include a functional region located proximate a front side of the semiconductor workpiece (e.g. proximate a front side of the wafer or die); the at least one laser fuse may be located at or near an interface between the substrate region and the functional region, and the infrared laser beam may be focused onto the interface.

In accordance with another embodiment, the infrared laser beam may be configured (or applied) such that integrity of structures located in the functional region on or above the at least one laser fuse is substantially (e.g. entirely) maintained after fusing the at least one laser fuse.

In accordance with another embodiment, the at least one laser fuse may contain (or consist of) a silicide.

In accordance with another embodiment, the silicide may be selected from a group of silicides having an activation temperature of less than or equal to about 750° C., for example less than or equal to about 550° C., for example less than or equal to about 350° C.

In accordance with another embodiment, the silicide may be selected from a group of silicides, the group consisting of: tungsten silicide, molybdenum silicide, titanium silicide, cobalt silicide, and nickel silicide.

In accordance with another embodiment, the at least one laser fuse may include or may be a polycide (i.e. silicide formed over polysilicon), for example a silicided polysilicon pattern or structure, for example a silicided polysilicon trace or interconnect.

In accordance with another embodiment, the infrared laser beam may have a wavelength in the range from about 1.0 µm to about 1.4 µm, for example a wavelength of about 1064 nm, 1080 nm, or 1342 nm, although other wavelengths may be possible as well.

In accordance with another embodiment, the functional region may include at least one circuit structure or device, for example, a pad (e.g. metal pad), an interconnect, a wiring line, a resistor (e.g. metal resistor), a capacitor (e.g. a MIM capacitor), a diode, a transistor, or others.

In accordance with another embodiment, the functional region may include a front-end-of-line (FEOL) layer arrangement, for example including one or more electrically conductive layers (e.g. metal layers) and/or one more electrically insulating layers or dielectric layers (e.g. low-k or ultra-low-k dielectric layers).

In accordance with another embodiment, the laser beam may have a power in the range from about 0.1 W to about 0.5 W, although other values may be possible as well.

In accordance with another embodiment, the semiconductor workpiece may include a plurality of laser fuses, a fuse pitch of the plurality of laser fuses being less than or equal to about 10 µm, for example in the range from about 5 µm to about 10 µm in accordance with another embodiment, for example about 10 µm in accordance with another embodiment, although other values of the pitch (e.g. pitches less than or equal to about 5 µm, or pitches greater than about 10 µm) may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, the semiconductor workpiece may include or may be a wafer, and the wafer may be diced using the infrared laser beam.

In accordance with another embodiment, dicing may be carried out using the same laser equipment as used for fusing the at at least one laser fuse (or at least one of the plurality of laser fuses).

In accordance with another embodiment, dicing the wafer may be carried out after fusing the at least one laser fuse, or at least one of the plurality of laser fuses, in accordance with another embodiment.

In accordance with another embodiment, dicing the wafer may be carried out before fusing the at least one laser fuse, or at least one of the plurality of laser fuses.

A method for fusing a laser fuse in accordance with one or more embodiments may include: providing a semiconductor workpiece having a substrate region located proximate a back side of the semiconductor workpiece and a functional region located proximate a front side of the semiconductor workpiece, at least one laser fuse being located at or near an interface between the substrate region and the functional region; irradiating the back side of the semiconductor workpiece with an infrared laser beam focused onto the interface between the substrate region and the functional region, to fuse the at least one laser fuse.

In accordance with an embodiment, the semiconductor workpiece may include or may be wafer. In accordance with another embodiment, the semiconductor workpiece may include or may be a die.

In accordance with an embodiment, the wafer or die may be a silicon wafer or die, although the wafer or die may contain or consist of other materials, e.g. other semiconductor materials, including compound semiconductor materials, as well.

In accordance with another embodiment, the infrared laser beam may be configured (or applied) such that integrity of structures located in the functional region on or above the at least one laser fuse is substantially maintained after fusing the at least one laser fuse.

In accordance with another embodiment, the at least one laser fuse may contain (or consist of) a silicide.

In accordance with another embodiment, the silicide may be selected from a group of silicides having an activation temperature of less than or equal to about 750° C., for example less than or equal to about 550° C., for example less than or equal to about 350° C.

In accordance with another embodiment, the silicide may be selected from a group of silicides, the group consisting of: tungsten silicide, molybdenum silicide, titanium silicide, cobalt silicide, and nickel silicide.

In accordance with another embodiment, the at least one laser fuse may include or may be a polycide (i.e. silicide formed over polysilicon), for example a silicided polysilicon pattern, for example a silicided polysilicon trace or interconnect.

In accordance with another embodiment, the infrared laser beam may have a wavelength in the range from about 1.0 µm to about 1.4 µm, for example a wavelength of about 1064 nm, 1080 nm, or 1342 nm, although other wavelengths may be possible as well.

In accordance with another embodiment, the functional region may include at least one circuit structure or device, for example, a pad (e.g. metal pad), an interconnect, a wiring line, a resistor (e.g. metal resistor), a capacitor (e.g. a MIM capacitor), a diode, a transistor, or others.

In accordance with another embodiment, the functional region may include a front-end-of-line (FEOL) layer arrangement, for example including one or more electrically conductive layers (e.g. metal layers) and/or one or more electrically insulating layers or dielectric layers (e.g. low-k or ultra-low-k dielectric layers).

In accordance with another embodiment, the laser beam may have a power in the range from about 0.1 W to about 0.5 W, although other values may be possible as well.

In accordance with another embodiment, the semiconductor workpiece may include a plurality of laser fuses located at or near the interface between the substrate region and the functional region, a fuse pitch of the plurality of laser fuses being less than or equal to about 10 µm, for example, in the range from about 5 µm to about 10 µm in accordance with another embodiment, for example about 10 µm in accordance with another embodiment, although other pitches, e.g. less than about 5 µm, or greater than about 10 µm, may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, the semiconductor workpiece may include or may be a wafer, and the wafer may be diced using the infrared laser beam.

In accordance with another embodiment, dicing may be carried out using the same laser equipment as used for fusing the at at least one laser fuse (or at least one of the plurality of laser fuses).

In accordance with another embodiment, dicing the wafer may be carried out after fusing the at least one laser fuse, or at least one of the plurality of laser fuses, in accordance with another embodiment.

In accordance with another embodiment, dicing the wafer may be carried out before fusing the at least one laser fuse, or at least one of the plurality of laser fuses.

A method for fusing a laser fuse in accordance with one or more embodiments may include: providing a wafer or die having at least one laser fuse, the at least one laser fuse containing (or consisting of) a silicide; irradiating the wafer or die from the back side of the wafer or die with infrared laser light to melt the silicide of the at least one laser fuse.

In accordance with an embodiment, the silicide may be selected from a group of silicides having an activation temperature of less than or equal to about 750° C.

In accordance with another embodiment, the silicide may be selected from a group of silicides having an activation temperature of less than or equal to about 550° C.

In accordance with another embodiment, the silicide may be selected from a group of silicides having an activation temperature of less than or equal to about 350° C.

In accordance with another embodiment, the silicide may be selected from a group of silicides, the group consisting of: tungsten silicide, molybdenum silicide, titanium silicide, cobalt silicide, and nickel silicide.

In accordance with another embodiment, the wafer or die may be a silicon wafer or die, although the wafer or die may contain or consist of other materials, e.g. other semiconductor materials, including compound semiconductor materials, as well.

In accordance with another embodiment, the laser light may be focused onto an interface between a substrate region and a functional region of the silicon wafer or die.

In accordance with another embodiment, the infrared laser light may have a wavelength in the range from about 1.0 µm to about 1.4 µm, for example a wavelength of about 1064 nm, 1080 nm, or 1342 nm, although other wavelengths may be possible as well.

In accordance with another embodiment, the infrared laser light may have a power in the range from about 0.1 W to about 0.5 W, although other values may be possible as well.

In accordance with another embodiment, the wafer or die may include a plurality of laser fuses located at or near the interface between the substrate region and the functional region, a fuse pitch of the plurality of laser fuses being less than or equal to about 10 µm, for example, in the range from about 5 µm to about 10 µm in accordance with another embodiment, for example about 10 µm in accordance with another embodiment, although other pitches, e.g. less than about 5 µm, or greater than about 10 µm, may be possible as well in accordance with other embodiments. The plurality of laser fuses may, for example, be configured as or arranged in an array (also referred to as fuse array or laser fuse array) or bank (also referred to as fuse bank or laser fuse bank) in accordance with another embodiment.

In accordance with another embodiment, providing a wafer or die may include providing a wafer, and the wafer may be diced using the infrared laser beam.

In accordance with another embodiment, dicing may be carried out using the same laser equipment as used for fusing the at at least one laser fuse (or at least one of the plurality of laser fuses).

In accordance with another embodiment, dicing the wafer may be carried out after fusing the at least one laser fuse, or at least one of the plurality of laser fuses, in accordance with another embodiment.

In accordance with another embodiment, dicing the wafer may be carried out before fusing the at least one laser fuse, or at least one of the plurality of laser fuses.

A method for processing a wafer in accordance with various embodiments may include: providing a wafer having at least one laser fuse; fusing the at least one laser fuse from the wafer back side; and stealth dicing the wafer; wherein fusing the at least one laser fuse and stealth dicing the wafer includes using the same infrared laser.

In accordance with an embodiment, the at least one laser fuse may contain (or consist of) a silicide.

In accordance with another embodiment, stealth dicing the wafer may be carried out after fusing the at least one laser fuse.

In accordance with another embodiment, stealth dicing the wafer may be carried out before fusing the at least one laser fuse.

The method may further be configured in accordance with one or more embodiments described herein.

A method for fusing a laser fuse in accordance with one or more embodiments may include: providing a semiconductor workpiece, for example a wafer or a die, including at least one laser fuse; and fusing the at least one laser fuse from a back side of the semiconductor workpiece (e.g. wafer or die) by means of an infrared laser beam.

A method for fusing a laser fuse in accordance with one or more embodiments may include: providing a wafer or die having a substrate region located proximate a back side of the wafer or die and a functional region located proximate a front side of the wafer or die, at least one laser fuse being located at or near an interface between the substrate region and the functional region; and irradiating the back side of the wafer or die with an infrared laser beam focused onto the interface between the substrate region and the functional region, to fuse the at least one laser fuse.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for fusing a laser fuse, the method comprising:
providing a wafer or die comprising a substrate region and at least one laser fuse;
fusing the at least one laser fuse from a back side of the substrate region by means of an infrared laser beam,
wherein the at least one laser fuse is disposed within the wafer or die.

2. The method of claim 1,
wherein the substrate region is located proximate a back side of the wafer or die, and
wherein the wafer or die further comprises a functional region located proximate a front side of the wafer or die;
wherein the at least one laser fuse is located at or near an interface between the substrate region and the functional region; and
wherein the infrared laser beam is focused onto the interface.

3. The method of claim 2,
wherein the infrared laser beam is configured such that integrity of structures located in the functional region on or above the at least one laser fuse is substantially maintained after fusing the at least one laser fuse.

4. The method of claim 1,
wherein the infrared laser beam has a wavelength in the range from about 1.0 µm to about 1.4 µm.

5. The method of claim 1,
wherein the laser beam has a power in the range from about 0.1 W to about 0.5 W.

6. The method of claim 1,
wherein the wafer or die comprises a plurality of laser fuses, a fuse pitch of the plurality of laser fuses being less than or equal to about 10 µm.

7. The method of claim 1, further comprising:
dicing the wafer using the infrared laser beam.

8. The method of claim 1,
wherein the at least one laser fuse comprises a silicide.

9. The method of claim 8,
wherein the silicide is selected from a group of silicides having an activation temperature of less than or equal to about 750° C.

10. The method of claim 8,
wherein the silicide is selected from a group of silicides having an activation temperature of less than or equal to about 550° C.

11. The method of claim 8,
wherein the silicide is selected from a group of silicides having an activation temperature of less than or equal to about 350° C.

12. The method of claim 8,
wherein the silicide is selected from a group of silicides, the group consisting of: tungsten silicide, molybdenum silicide, titanium silicide, cobalt silicide, and nickel silicide.

13. A method for fusing a laser fuse, the method comprising:
providing a wafer or die comprising a substrate region located proximate a back side of the wafer or die and a functional region located proximate a front side of the wafer or die, at least one laser fuse being located at or near an interface between the substrate region and the functional region;
irradiating the back side of the wafer or die with an infrared laser beam focused onto the interface between the substrate region and the functional region, to fuse the at least one laser fuse,
wherein the at least one laser fuse is disposed within the wafer or die.

14. The method of claim 13, wherein the infrared laser beam is configured such that integrity of structures located in the functional region on or above the at least one laser fuse is substantially maintained after fusing the at least one laser fuse.

15. The method of claim 13,
wherein the infrared laser beam has a wavelength in the range from about 1.0 µm to about 1.4 µM.

16. The method of claim 13,
wherein the laser beam has a power in the range from about 0.1 W to about 0.5 W.

17. The method of claim 13,
wherein the wafer or die comprises a plurality of laser fuses located at or near the interface between the substrate region and the functional region, a fuse pitch of the plurality of laser fuses being less than or equal to about 10 µm.

18. The method of claim 13, further comprising:
dicing the wafer using the infrared laser beam.

19. The method of claim 13,
wherein the at least one laser fuse comprises a silicide.

20. The method of claim 19,
wherein the silicide is selected from a group of silicides having an activation temperature of less than or equal to about 750° C.

21. The method of claim 19,
wherein the silicide is selected from a group of silicides, the group consisting of: tungsten silicide, molybdenum silicide, titanium silicide, cobalt silicide, and nickel silicide.

22. A method for fusing a laser fuse, the method comprising:
providing a wafer or die comprising at least one laser fuse disposed within the wafer or die, the laser fuse comprising a silicide;
irradiating the wafer or die from the back side of the wafer or die with infrared laser light to melt the silicide of the at least one laser fuse.

23. The method of claim 22,
wherein the silicide is selected from a group of silicides having an activation temperature of less than or equal to about 750° C.

24. The method of claim 22, wherein the silicide is selected from a group of silicides having an activation temperature of less than or equal to about 550° C.

25. The method of claim 22, wherein the silicide is selected from a group of silicides having an activation temperature of less than or equal to about 350° C.

26. The method of claim 22, wherein the silicide is selected from a group of silicides, the group consisting of: titanium silicide, cobalt silicide, and nickel silicide.

27. The method of claim 22, wherein the infrared laser light has a wavelength in the range from about 1.0 μm to about 1.4 μm.

28. The method of claim 22, wherein the infrared laser light has a power in the range from about 0.1 W to about 0.5 W.

29. A method for processing a wafer, the method comprising:
providing a wafer having at least one laser fuse disposed within the wafer;
fusing the at least one laser fuse from the wafer back side; and
stealth dicing the wafer;
wherein fusing the at least one laser fuse and stealth dicing the wafer are carried out using the same infrared laser.

30. The method of claim 29, wherein the at least one laser fuse comprises a silicide.

\* \* \* \* \*